United States Patent
Jeong et al.

(10) Patent No.: US 11,710,455 B2
(45) Date of Patent: *Jul. 25, 2023

(54) PIXEL, ORGANIC LIGHT EMITTING DISPLAY DEVICE USING THE SAME, AND METHOD OF DRIVING THE ORGANIC LIGHT EMITTING DISPLAY DEVICE

(71) Applicant: SAMSUNG DISPLAY CO., LTD., Yongin-si (KR)

(72) Inventors: Jin Tae Jeong, Yongin-si (KR); Min Ku Lee, Yongin-si (KR); Ji Hyun Ka, Yongin-si (KR); Tae Hoon Kwon, Yongin-si (KR); Seung Kyu Lee, Yongin-si (KR); Seung Ji Cha, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/436,016

(22) Filed: Jun. 10, 2019

(65) Prior Publication Data

US 2019/0295471 A1 Sep. 26, 2019

Related U.S. Application Data

(63) Continuation of application No. 15/601,012, filed on May 22, 2017, now Pat. No. 10,319,306.

(30) Foreign Application Priority Data

Jun. 17, 2016 (KR) .................. 10-2016-0075520

(51) Int. Cl.
*G09G 3/3258* (2016.01)
*G09G 3/3225* (2016.01)
*H10K 59/123* (2023.01)

(52) U.S. Cl.
CPC ......... *G09G 3/3258* (2013.01); *G09G 3/3225* (2013.01); *H10K 59/123* (2023.02);
(Continued)

(58) Field of Classification Search
CPC ............... G09G 3/3258; G09G 3/3225; G09G 2310/0262; G09G 2310/0216;
(Continued)

(56) References Cited

U.S. PATENT DOCUMENTS 7,659,872 B2 2/2010 Yamashita et al.
7,755,585 B2 7/2010 Kim
(Continued)

FOREIGN PATENT DOCUMENTS

CN 1964585 5/2007
CN 101866614 10/2010
(Continued)

OTHER PUBLICATIONS

Provisional double patenting rejection over claims of the above-identified application; USPTO Office action dated Sep. 19, 2018, in U.S. Appl. No. 15/666,795.
(Continued)

*Primary Examiner* — Shaheda A Abdin
(74) *Attorney, Agent, or Firm* — F. Chau & Associates, LLC

(57) ABSTRACT

A pixel includes an organic light emitting diode (OLED), a pixel circuit, and first and second transistors. The OLD includes a cathode electrode connected to a second power source. The pixel circuit includes a driving transistor having a gate electrode initialized by a third power source. The driving transistor controls the amount of current flowing from a first power source to the second power source via the OLED. The first transistor is connected between a fourth power source and the second power source and an anode (Continued)

electrode of the OLED. The first transistor is turned on based on a scan signal is supplied to a scan line. The second transistor is connected between a data line and the pixel circuit. The second transistor is turned on when the scan signal is supplied to the ith scan line.

17 Claims, 6 Drawing Sheets

(52) U.S. Cl.
CPC ............. *G09G 2300/0819* (2013.01); *G09G 2310/0216* (2013.01); *G09G 2310/0251* (2013.01); *G09G 2310/0262* (2013.01); *G09G 2320/0214* (2013.01); *G09G 2320/0238* (2013.01); *G09G 2320/045* (2013.01)

(58) Field of Classification Search
CPC ... G09G 2300/0819; G09G 2320/0238; G09G 2320/045; G09G 2320/0214; H01L 27/3248
See application file for complete search history.

(56) References Cited

U.S. PATENT DOCUMENTS

| | | | |
|---|---|---|---|
| 7,796,102 B2 | 9/2010 | Ishizuka et al. | |
| 8,803,770 B2 | 8/2014 | Jeong et al. | |
| 8,907,870 B2 | 12/2014 | Kang et al. | |
| 9,208,727 B2 | 12/2015 | Lee et al. | |
| 9,478,164 B2 | 10/2016 | Ma | |
| 9,548,026 B2 | 1/2017 | Jang | |
| 9,647,047 B2 | 5/2017 | Jeong et al. | |
| 2005/0017934 A1* | 1/2005 | Chung | G09G 3/3233 345/82 |
| 2005/0259142 A1* | 11/2005 | Kwak | H01L 27/3244 347/238 |
| 2007/0103406 A1 | 5/2007 | Kim | |
| 2008/0143651 A1 | 6/2008 | Choi et al. | |
| 2008/0169754 A1 | 7/2008 | Yang et al. | |
| 2010/0013816 A1* | 1/2010 | Kwak | G09G 3/3233 345/211 |
| 2010/0079361 A1 | 4/2010 | Lee et al. | |
| 2010/0164847 A1* | 7/2010 | Lee | G09G 3/3233 345/77 |
| 2010/0265166 A1 | 10/2010 | Kang et al. | |
| 2011/0080395 A1 | 4/2011 | Chung | |
| 2012/0026146 A1* | 2/2012 | Kim | G09G 3/3233 345/78 |
| 2012/0075251 A1 | 3/2012 | Yamauchi | |
| 2012/0206557 A1 | 8/2012 | Ridges et al. | |
| 2013/0043802 A1 | 2/2013 | Han et al. | |
| 2013/0088417 A1* | 4/2013 | Kim | G09G 3/3233 345/82 |
| 2014/0292734 A1 | 10/2014 | Pyon | |
| 2014/0347347 A1 | 11/2014 | Jeong et al. | |
| 2014/0354517 A1 | 12/2014 | Chung et al. | |
| 2015/0097762 A1 | 4/2015 | Kim | |
| 2015/0294618 A1 | 10/2015 | Park et al. | |
| 2015/0348462 A1 | 12/2015 | Ma | |
| 2017/0110054 A1 | 4/2017 | Sun et al. | |
| 2017/0365218 A1 | 12/2017 | Jeong et al. | |
| 2018/0061324 A1 | 3/2018 | Kim et al. | |

FOREIGN PATENT DOCUMENTS

| | | |
|---|---|---|
| CN | 103985352 | 8/2014 |
| CN | 104183215 | 12/2014 |
| CN | 105405397 A | 3/2016 |
| JP | 2007-102046 | 4/2007 |
| KR | 10-2010-0115062 | 10/2010 |
| KR | 10-1152466 B1 | 6/2012 |
| KR | 10-2014-0025149 A | 3/2014 |
| KR | 10-2014-0134046 A | 11/2014 |
| KR | 10-2015-0062349 | 6/2015 |
| KR | 10-2015-0064543 A | 6/2015 |
| KR | 10-2018-0023098 A | 3/2018 |
| TW | 200535759 | 11/2005 |

OTHER PUBLICATIONS

Extended European Search Report was dated Aug. 25, 2017 with respect to the European Patent Application No. 17176242.0.
Office Action dated Jan. 17, 2020 in corresponding European Patent Appln. No. 17176242.0 (12 pages).
Office Action issued from the Japanese Patent Office dated Mar. 9, 2021 with respect to corresponding Japanese Patent Application No. 2017-118289 filed on Jun. 16, 2017.

\* cited by examiner

PIXEL, ORGANIC LIGHT EMITTING DISPLAY DEVICE USING THE SAME, AND METHOD OF DRIVING THE ORGANIC LIGHT EMITTING DISPLAY DEVICE

CROSS-REFERENCE TO RELATED APPLICATION

This application is a continuation of U.S. application Ser. No. 15/691,012 filed on May 22, 2017, which claims priority under 35 U.S.C. § 119 of Korean Patent Application No. 10-2016-0075520, filed on Jun. 17, 2016, in the Korean Intellectual Property Office, the disclosure of both applications are incorporated by reference herein.

BACKGROUND

1. Field

One or more embodiments herein relate to a pixel, an organic light emitting display device, and a method for driving an organic light emitting display device.

2. Description of the Related Art

A variety of displays have been developed. Examples include liquid crystal displays and organic light emitting displays. An organic light emitting display generates images based on light from organic light emitting diodes (OLEDs). Each pixel includes a driving transistor for controlling current to an OLED. The amount of current supplied from the driving transistor is based on a data signal.

An OLED may emit light based on low current. As a result, an organic light emitting display may operate at low power to display images with high brightness. However, when OLEDs emit components at low current, black brightness may increase.

Also, in order to implement high brightness, a second power source voltage may be connected to cathode electrodes of the OLEDs may be low. However, as the voltage of the second power source is reduced, the voltage of an initializing power source is reduced. Consequently, leakage current flowing from gate electrodes of the driving transistors to the initializing power source may increase to deteriorate picture quality.

SUMMARY

In accordance with one or more embodiments, a pixel includes an organic light emitting diode (OLED) including a cathode electrode connected to a second power source; a pixel circuit including a driving transistor having a gate electrode to be initialized by a third power source, the driving transistor to control an amount of current that flows from a first power source to the second power source via the OLED; a first transistor connected between a fourth power source different from the third power source and the second power source and an anode electrode of the OLED, the first transistor to be turned on based on a scan signal supplied to an ith (i is a natural number) scan line; and a second transistor connected between a data line and the pixel circuit, the second transistor to be turned on when the scan signal is supplied to the ith scan line.

A voltage of the third power source may be greater than a voltage of the fourth power source. A voltage of the fourth power source may be greater than a voltage of the second power source. A voltage of the third power source may be greater than a voltage of a data signal supplied to the data line.

The pixel circuit may include at least one third transistor connected between a gate electrode of the driving transistor and the third power source, the at least one third transistor to be turned on based on a scan signal supplied to an (i-1)th scan line; at least one fourth transistor connected between the gate electrode of the driving transistor and a second electrode of the driving transistor, the at least one fourth transistor to be turned on based on the scan signal supplied to the ith scan line; a fifth transistor connected between a first electrode of the driving transistor and the first power source, the fifth transistor to have a turn-on period that does not overlap a turn-on period of the second transistor; and a sixth transistor connected between the second electrode of the driving transistor and the anode electrode of the OLED, the fifth and sixth transistors to be simultaneously turned on and turned off. The second transistor may be connected to the first electrode of the driving transistor.

In accordance with one or more other embodiments, an organic light emitting display device includes a plurality of pixels connected to scan lines, data lines, and emission control lines; a scan driver to supply scan signals to the scan lines; an emission control driver to supply emission control signals to the emission control lines; and a data driver to supply data signals to the data lines, wherein each of the pixels on an ith (i is a natural number) horizontal line includes: an OLED having a cathode electrode connected to a second power source; a pixel circuit including a driving transistor to control an amount of current that flows from a first power source to the second power source via the OLED; a first transistor connected between a fourth power source different from the third power source and the second power source and an anode electrode of the OLED, the first transistor to be turned on based on a scan signal supplied to an ith scan line; a second transistor connected between a data line and the pixel circuit, the second transistor to be turned on based on the scan signal supplied to the ith scan line; and a third transistor connected between a gate electrode of the driving transistor and the third power source, the third transistor to be turned on based on a scan signal supplied to an (i-1)th scan line.

A voltage of the third power source may be greater than a voltage of the fourth power source. A voltage of the fourth power source may be greater than a voltage of the second power source. A voltage of the third power source may be greater than a voltage of the data signal. An emission control signal may be supplied to an ith emission control line overlaps the scan signals to be supplied to the (i-1)th scan line and the ith scan line.

The pixel circuit may include at least one fourth transistor connected between the gate electrode of the driving transistor and a second electrode of the driving transistor, the at least one fourth transistor to be turned on based on the scan signal supplied to the ith scan line; a fifth transistor connected between a first electrode of the driving transistor and the first power source, the fifth transistor to be turned off based on the emission control signal supplied to the ith emission control line; and a sixth transistor connected between the second electrode of the driving transistor and the anode electrode of the OLED, the sixth transistor to be turned off based on the emission control signal supplied to the ith emission control line. The second transistor may be connected to the first electrode of the driving transistor.

In accordance with one or more other embodiments, a method is provided to drive an organic light emitting display device, including pixels connected to scan lines and data lines, the pixels including driving transistors to control amounts of currents supplied to organic light emitting diode (OLEDs) based on data signals. The method includes initializing gate electrodes of the driving transistors based on a voltage of a third power source; storing the data signals and initializing anode electrodes of the OLEDs based on a voltage of a fourth power source; and controlling amounts of currents that flow from a first power source to a second power source, via the OLEDs, based on the data signals, a voltage of the fourth power source greater than a voltage of the second power source. A voltage of the third power source may be greater than a voltage of the fourth power source. A voltage of the third power source may be greater than a voltage of the data signal.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
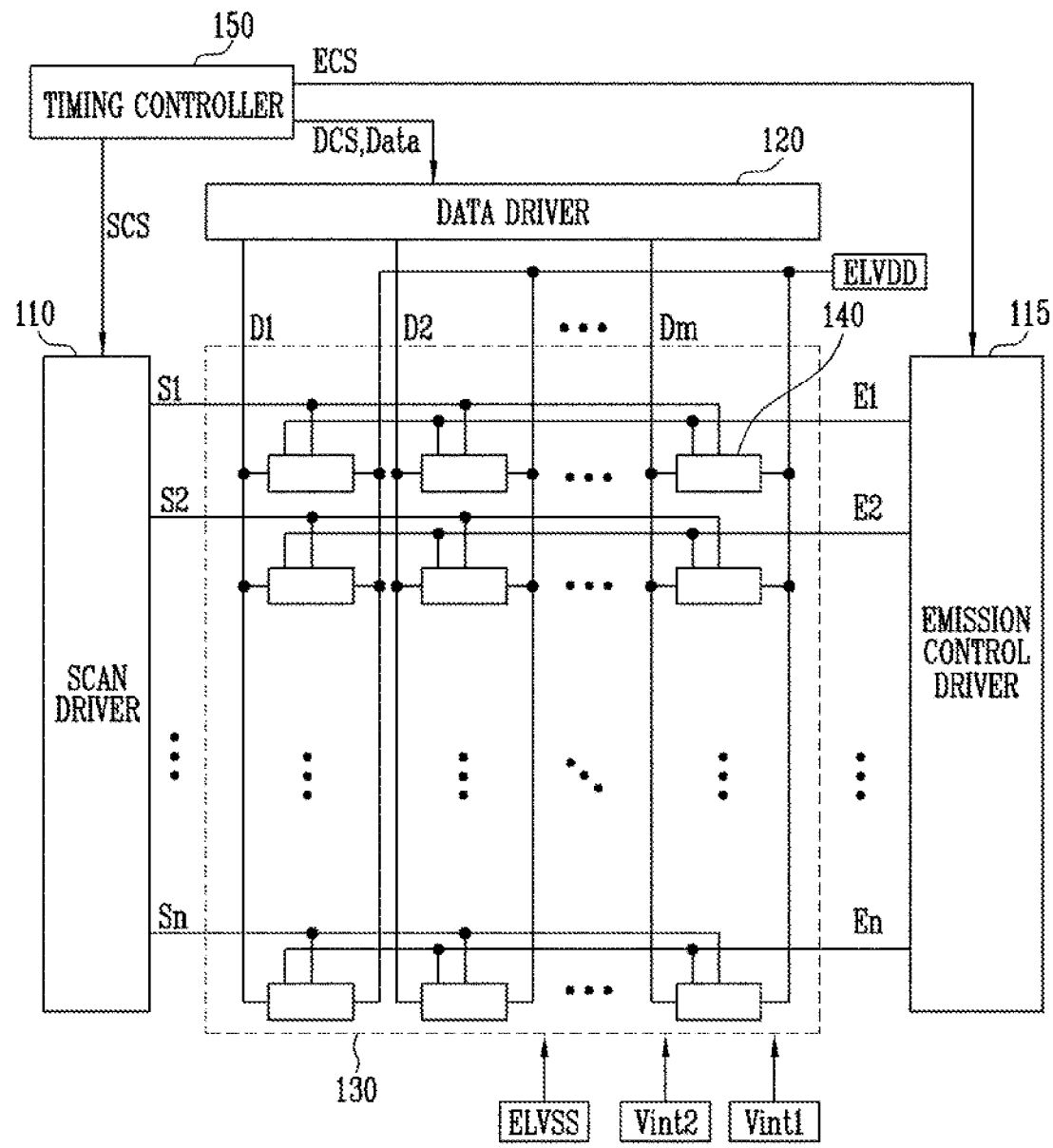
FIG. 1 illustrates an embodiment of an organic light emitting display device.

Example embodiments are described with reference to the drawings; however, they may be embodied in different forms and should not be construed as limited to the embodiments set forth herein. Rather, these embodiments are provided so that this disclosure will be thorough and complete, and will convey exemplary implementations to those skilled in the art. The embodiments (or portions thereof) may be combined to form additional embodiments.

In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

When an element is referred to as being "connected." or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

FIG. 1 illustrates an embodiment of an organic light emitting display device including pixels 140 connected to scan lines S1 through Sn, emission control lines E1 through En, and data lines D1 through Dm, a scan driver 110 for driving the scan lines S1 through Sn, an emission control driver 115 for driving the emission control lines E1 through En, a data driver 120 for driving the data lines D1 through Dm, and a timing controller 150 for controlling the scan driver 110, the emission control driver 115, and the data driver 120.

The timing controller 150 generates a data driving control signal DCS, a scan driving control signal SCS, and an emission driving control signal ECS based on synchronizing signals supplied from an external source. The data driving control signal DCS generated by the timing controller 150 is supplied to the data driver 120. The scan driving control signal SCS generated by the timing controller 150 is supplied to the scan driver 110. The emission driving control signal ECS generated by the timing controller 150 is supplied to the emission control driver 115. The timing controller 150 realigns data Data supplied from an external source and supplies the realigned data Data to the data driver 120.

The scan driving control signal includes SCS Start pulses and clock signals. The start pulses control first timings of scan signals. The clock signals are used for shifting the start pulses.

The emission driving control signal ECS includes start pulses and clock signals. The start pulses control first timings of emission control signals. The clock signals are used for shifting the start pulses.

The data driving control signal DCS includes source start pulses and clock signals. The source start pulses control sampling start points of time of the data. The clock signals are used for controlling sampling operations.

The scan driver 110 receives the scan driving control signal SCS from the timing controller 150 and supplies the scan signals to scan lines S1 through Sn based on the scan driving control signal SCS. For example, the scan driver 110 may sequentially supply the scan signals to the scan lines S1 through Sn. When the scan signals are sequentially supplied to the scan lines S1 through Sn, the pixels 140 are selected in units of horizontal lines.

The emission control driver 115 receives the emission driving control signal ECS from the timing controller 150 and supplies the emission control signals to emission control lines E1 through En based on the emission driving control signal ECS. For example, the emission control driver 115 may sequentially supply the emission control signals to the emission control lines E1 through En. The emission control signals are used for controlling emission times of the pixels 140. For this purpose, the emission control signals may be set to have greater widths than the scan signals. For example, an emission control signal supplied to an ith is a natural number) emission control line may overlap scan signals supplied to an (i-1)th scan line Si-1 and an ith scan line Si.

The scan driver 110 and the emission control driver 115 may be mounted on a substrate through a thin film process. In addition, the scan driver 110 and the emission control driver 115 may be on different sides, with the pixel unit 130 therebetween. In addition, in FIG. 1, the scan driver 110 and the emission control driver 115 are separate from each other. In one embodiment, the emission control driver 115 may be in the scan driver 110.

The emission control signals may be set to have gate off voltages (for example, high voltages) to turn off transistors in the pixels 140. The scan signals may be set to have gate on voltages (for example, low voltages) to turn on transistors in the pixels 140.

The data driver 120 supplies the data signals to the data lines D1 through Dm based on the data driving control signal DCS. The data signals are supplied to the pixels 140 selected by the scan signals. The data driver 120 may supply the data signals to the data lines D1 through Dm in synchronization with the scan signals.

The pixel unit 130 includes the pixels 140 connected to the scan lines S1 through Sn, the emission control lines E1 through En, and the data lines D1 through Dm. The pixels 140 receive a first power source ELVDD, a second power source ELVSS, a first initializing power source Vint1 (or a third power source), and a second initializing power source Vint2 (or a fourth power source) from an external source.

Each pixel 140 includes a driving transistor and an organic light emitting diode (OLED). The driving transistor controls the amount of current that flows from the first power source ELVDD to the second power source ELVSS, via the OLED, based on a data signal. Before the data signal is supplied, the voltage of a gate electrode of the driving transistor is initialized based on the voltage of the first initializing power source Vint1. The voltage of the first initializing power source Vint1 may be lower than the data signal voltage.

When the data signal is supplied, an anode electrode of the OLED is initialized by the second initializing power source Vint2. The voltage of the second initializing power source Vint2 may be lower than the voltage of the first initializing power source Vint1. In one embodiment, the voltage of the second initializing power source Vint2 may be greater than the voltage of the second power source ELVSS.

In FIG. 1, is scan lines S1 through Sn and n emission control lines E1 through En are illustrated. In one embodiment, in accordance with circuit structures of the pixels 140, the pixels 140 on an ith horizontal line may be additionally connected to a scan line (for example, the (i-1)th scan line) on a previous horizontal line. Dummy scan lines and/or dummy emission control lines may be additionally formed in the pixel unit 130.

Figure 2:
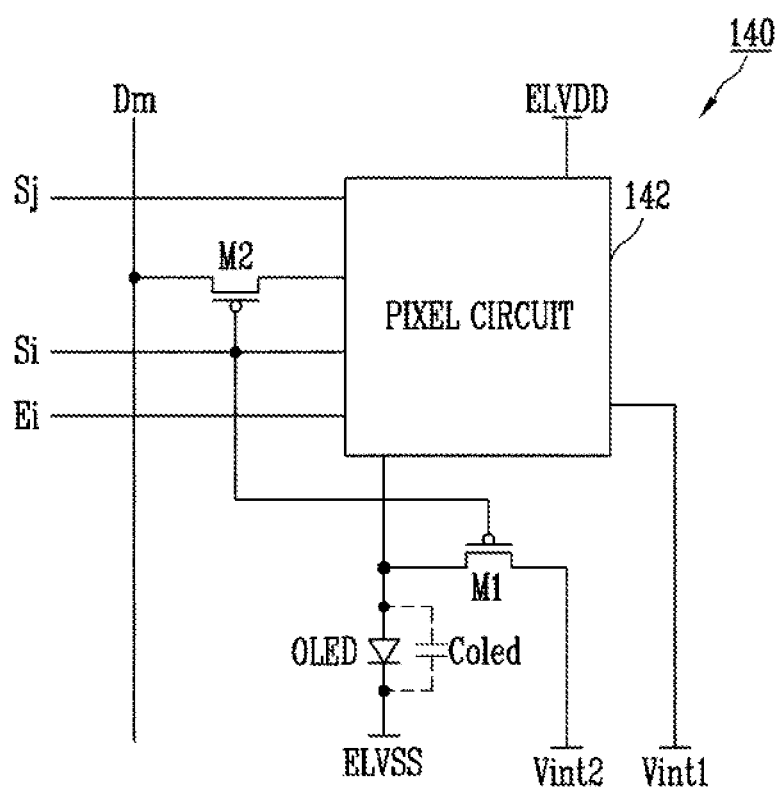
FIG. 2 illustrates an embodiment of a pixel.

FIG. 2 illustrates an embodiment of a pixel 140 connected to an mth data line Dm and in an ith horizontal line. Referring to FIG. 2, the pixel 140 includes a pixel circuit 142, an OLED, a first transistor M1, and a second transistor M2.

The OLED has an anode electrode connected to the pixel circuit 142 and a cathode electrode connected to the second power source ELVSS. The OLED generates light with predetermined brightness in accordance with the amount of current supplied from the pixel circuit 142.

The pixel circuit 142 initializes the voltage of the gate electrode of the driving transistor to the voltage of the first initializing power source Vint1 when a scan signal is supplied to a jth scan line Sj (j is a natural number). The jth scan line Sj may be different from the ith scan line Si. For example, the jth scan line Sj may be on a horizontal line prior to the ith scan line Si, for example, the (i-1)th scan line Si-1.

The pixel circuit 142 receives a data signal from the data line Din, via the second transistor M2, when a scan signal is supplied to the ith scan line Si. The pixel circuit 142 that receives the data signal controls the amount of current that flows from the first power source ELVDD to the second power source ELVSS, via the OLED, when supply of an emission control signal to an ith emission control line Ei is stopped. The pixel circuit 142 may be implemented by one of various types of circuits that receive the first initializing power source Vint1.

The first transistor M1 is connected between the anode electrode of the OLED and the second initializing power source Vint2. A gate electrode of the first transistor M1 is connected to the ith scan line Si. The first transistor M1 is turned on when the scan signal is supplied to the ith scan line Si and supplies a voltage of the second initializing power source Vint2 to the anode electrode of the OLED.

When the voltage of the second initializing power source Vint2 is supplied to the anode electrode of the OLED, a parasitic capacitor (an organic capacitor Coled) of the OLED is discharged. When the organic capacitor Coled is discharged, black display ability improves.

The organic capacitor Coled may charge a predetermined voltage, for example, in accordance with the current supplied from the pixel circuit 142 in a previous frame period. When the organic capacitor Coled is charged, the OLED may easily emit light at low current.

In a current frame period, a black data signal may be supplied to the pixel circuit 142. Ideally, when the black data signal is supplied, the pixel circuit 142 should not supply a current to the OLED. However, the transistors of the pixel circuit 142 may supply a predetermined leakage current to the OLED, even though the black data signal is supplied. At this time, when the organic capacitor Coled is charged, the OLED may emit a minute amount of light. This may deteriorate black display ability.

On the other hand, according to one or more embodiments, when the organic capacitor Coled is discharged by the second initializing power source Vint2, the OLED is set to be in a non-emission state by the leakage current. Thus, when the data signal is supplied to the pixel circuit 142, the second initializing power source Vint2 is supplied to the anode electrode of the OLED using the second initializing power source Vint2. As a result, black display ability may be improved.

The voltage of second initializing power source Vint2 may be lower than the voltage of the first initializing power source Vint1 and greater than the voltage of the second power source ELVSS. As a result, the organic capacitor Coled may be stably discharged. For example, the voltage of the second initializing power source Vint2 may be obtained, fore example, based on the sum of a threshold voltage of the OLED and the voltage of the second power source ELVSS.

In addition, according to the present embodiment, when the first initializing power source Vint1 and the second initializing power source Vint2 are separate from each other, the leakage current from the pixel circuit 142 may be reduced or minimized.

For example, in order to implement high brightness, the voltage of the second power source ELVSS connected to the cathode electrode of the OLED may be reduced. When the voltage of the second power source ELVSS is reduced, the amount of the current supplied from the pixel circuit 142 to the OLED increases, thereby producing an increase in the brightness of the OLED.

When the voltage of the second power source ELVSS is reduced, the voltage of the second initializing power source Vint2 may also be reduced. Therefore, when the first initializing power source Vint1 and the second initializing power source Vint2 are not separate from each other, leakage current that flows from the pixel circuit 142 to the initializing power source may increase as a result of a reduction in the voltage of the second power source ELVSS.

When the first initializing power source Vint1, and the second initializing power source Vint2 are separate from each other, the voltage of the first initializing power source Vint1 may be set regardless of the voltage of the second power source ELVSS. Actually, according to the present embodiment, the first initializing power source Vint1 may have a voltage greater than voltages of the second power source ELVSS and the second initializing power source Vint2. As a result, leakage current from the pixel circuit 142 to the first initializing power source Vint1 may be reduced or minimized.

When the voltage of the second initializing power source Vint2 is greater than the voltage of the second power source ELVSS, leakage current that flows from the pixel circuit 142 to the second initializing power source Vint2 in a period in which the OLED emits light may be reduced or minimized. As a result, the brightness of light emitted from the OLEO may increase.

Figure 3:
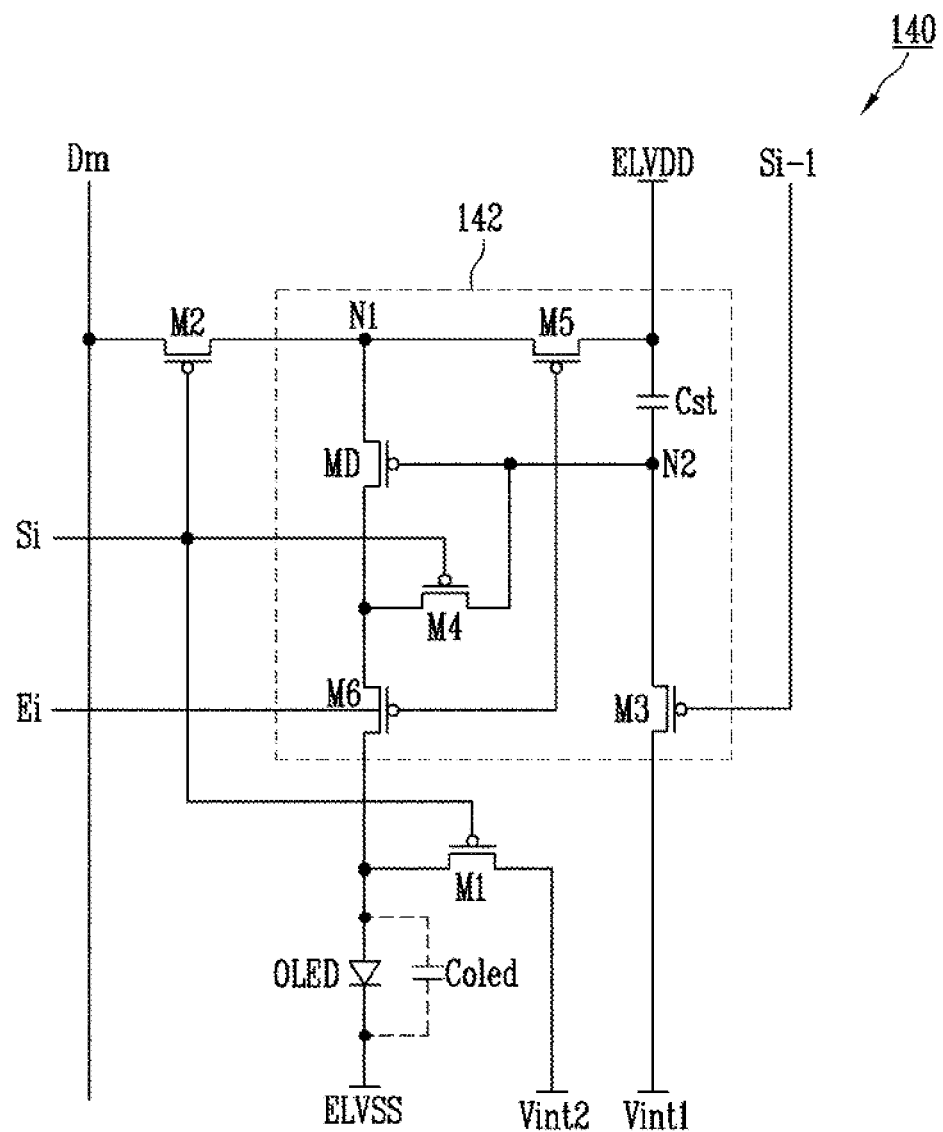
FIG. 3 illustrates an embodiment of a pixel circuit.

The second transistor M2 is connected between the data line Dm and the pixel circuit 142 (e.g., the first node N1 in FIG. 3). Then, a gate electrode of the second transistor M2 is connected to the ith scan line Si. The second transistor M2 is turned on when the scan signal is supplied to the ith scan line Si and supplies the data signal from the data line Din to the first node N1.

FIG. 3 illustrates an embodiment of the pixel circuit of FIG. 2, where the jth scan line is set as the (i-1)th scan line. Referring to FIG. 3, the pixel circuit 142 includes a driving transistor MD, a third transistor M3, a fourth transistor M4, a fifth transistor M5, a sixth transistor M6, and a storage capacitor Cst.

The driving transistor MD has a first electrode connected to the first node N1, a second electrode connected to a first electrode of the sixth transistor M6, and a gate electrode connected to a second node N2. The driving transistor MD controls the amount of current that flows from the first power source ELVDD to the second power source ELVSS, via the OLED, based on the voltage charged in the storage capacitor Cst.

The third transistor M3 has a first electrode connected to the second node N2, second electrode connected to the first initializing power source Vint1, and a gate electrode connected to the (i-1)th scan line Si-1. The third transistor M3 is turned on when the scan signal is supplied to the (i-1)th scan line Si-1 and supplies the voltage of the first initializing power source Vint1 to the second node N2.

The fourth transistor M4 has a first electrode connected to the second electrode of the driving transistor MD, a second electrode connected to the second node N2, and a gate electrode connected to the ith scan line Si. The fourth transistor M4 is turned on, when the scan signal is supplied to the ith scan line Si, to diode-connect the driving transistor MD.

The fifth transistor M5 has a first electrode connected to the first power source ELVDD, a second electrode connected to the first node N1, and a gate electrode connected to the emission control line Ei. The fifth transistor M5 is turned off when the emission control signal is supplied to the emission control line Ei and is turned on when the emission control signal is not supplied to the emission control line Ei.

The sixth transistor M6 has a first electrode connected to the second electrode of the driving transistor MD, a second electrode connected to the anode electrode of the OLED, and a gate electrode connected to the emission control line Ei. The sixth transistor M6 is turned off when the emission control signal is supplied to the emission control line Ei and is turned on when the emission control signal is not supplied to the emission control line Ei.

The storage capacitor Cst is connected between the first power source ELVDD and the second node N2. The storage capacitor Cst charges the voltage corresponding to a voltage of the data signal and a threshold voltage of the driving transistor MD.

Figure 4:
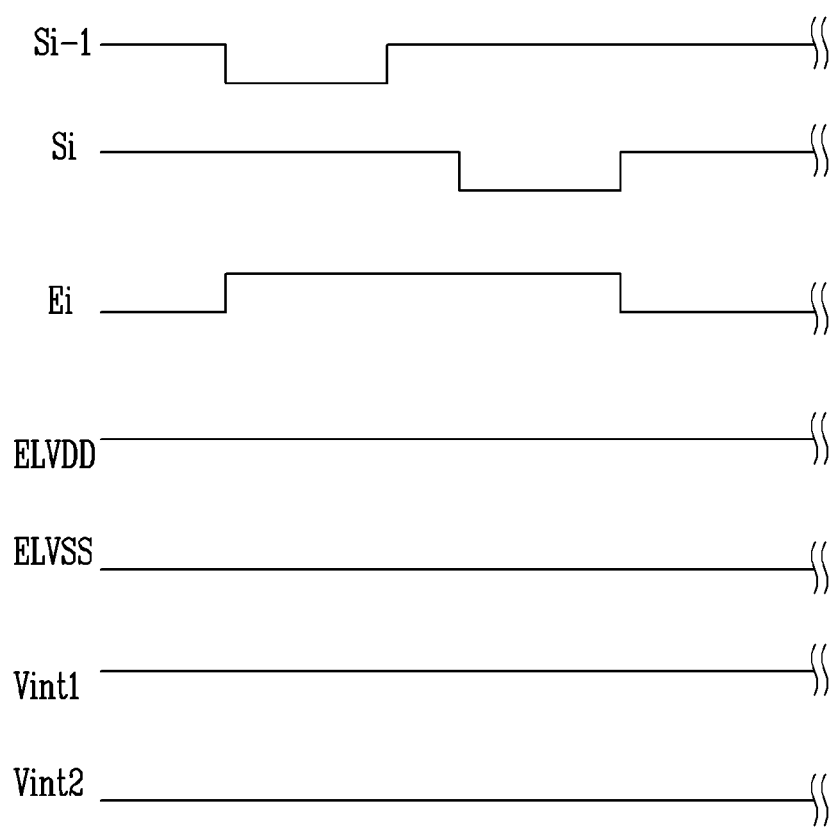
FIG. 4 illustrates an embodiment of a method for driving a pixel.

FIG. 4 illustrates an embodiment of a method for driving a pixel circuit, which, for example, may be the pixel of FIG. 3. Referring to FIG. 4, first, the emission control signal is supplied to the emission control line Ei to turn off the fifth transistor M5 and the sixth transistor M6. When the fifth transistor M5 is turned off, the first power source ELVDD and the first node N1 are electrically isolated from each other. When the sixth transistor M6 is turned off, the driving transistor MD and the OLED are electrically isolated from each other. Therefore, in a period in which the emission control signal is supplied, the pixel 140 is set to be in a non-emission state.

Then, the scan signal is supplied to the (i-1)th scan line Si-1. When the scan signal is supplied to the (i-1)th scan line Si-1, the third transistor M3 is turned on. When the third transistor M3 is turned on, the voltage of the first initializing power source Vint1 is supplied to the second node N2.

After the voltage of the first initializing power source Vint1 is supplied to the second node N2, the scan signal is supplied to the ith scan line Si. When the scan signal is supplied to the ith scan line Si, the first transistor M1, the second transistor M2, and the fourth transistor M4 are turned on.

When the first transistor M1 is turned on, the voltage of the second initializing power source Vint2 is supplied to the anode electrode of the OLED. When the voltage of the second initializing power source Vint2 is supplied to the anode electrode of the OLED, the organic capacitor Coled is discharged to improve black display ability.

When the fourth transistor M4 is turned on, the driving transistor MD is diode-connected. When the second transistor M2 is turned on, the data signal from the data line Dm is supplied to the first node N1. At this time, the driving transistor MD is turned on since the second node N2 is initialized by the voltage of the first initializing power source Vint1, lower than that of the data signal.

When the driving transistor MD is turned on, the data signal supplied to the first node N1 is supplied to the second node N2 via the diode-connected driving transistor MD. At this time, the second node N2 is set to have the voltage corresponding to the voltage of the data signal and the threshold voltage of the driving transistor MD. The storage capacitor Cst stores the voltage applied to the second node N2.

After the voltage corresponding to the voltage of the data signal and the threshold voltage of the driving transistor MD is charged in the storage capacitor Cst, supply of the emission control signal to the emission control line Ei is stopped. When the supply of the emission control signal to the emission control line Ei is stopped, the fifth transistor M5 and the sixth transistor M6 are turned on.

When the fifth transistor M5 is turned on, the first power source ELVDD and the first node N1 are electrically connected. When the sixth transistor M6 is turned on, the driving transistor MD and the anode electrode of the OLED are electrically connected. At this time, the driving transistor MD controls the amount of current that flows from the first power source ELVDD to the second power source ELVSS, via the OLED, based on the voltage applied to the second node N2.

Figure 5:
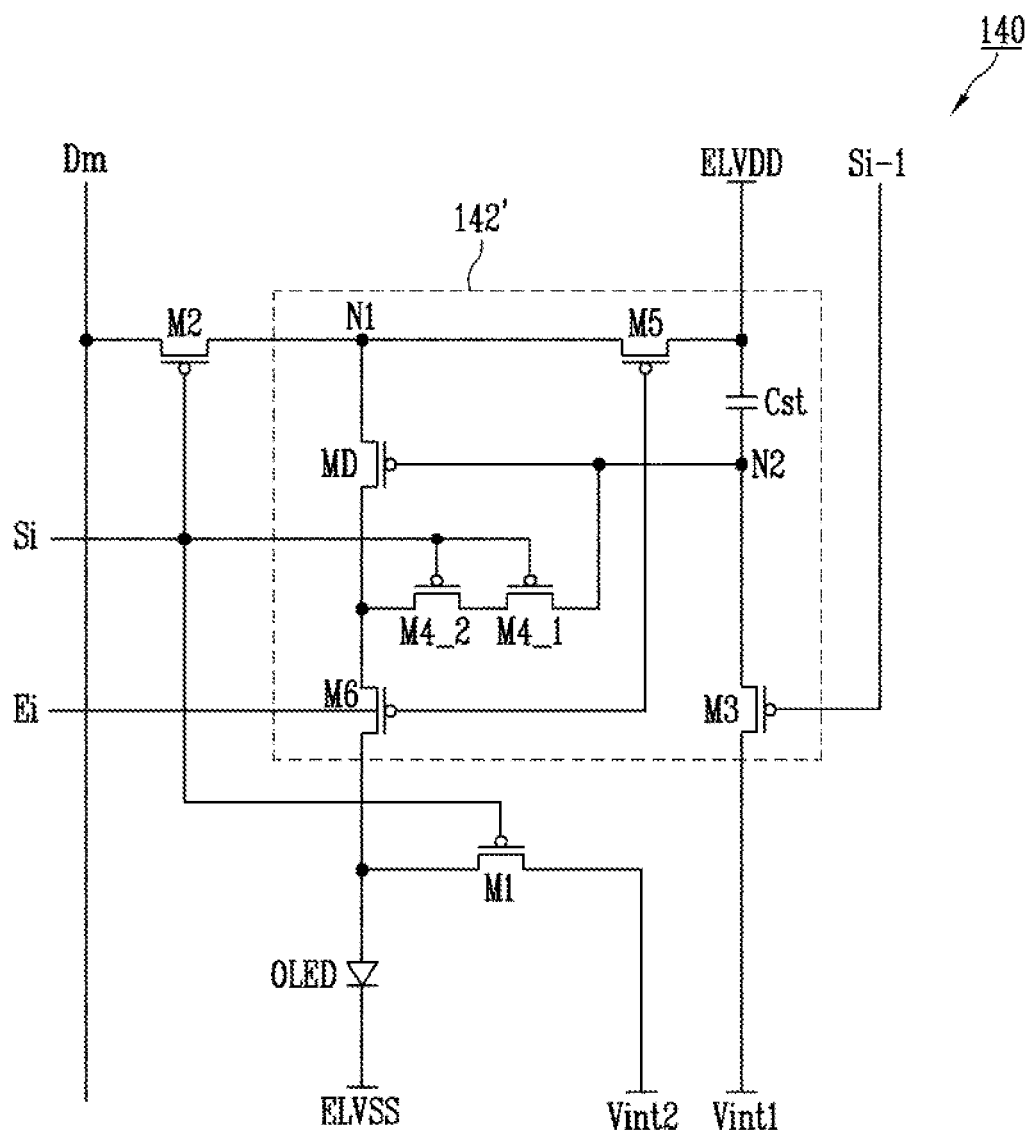
FIG. 5 illustrates another embodiment of a pixel circuit.

FIG. 5 illustrates another embodiment of a pixel circuit 142' in FIG. 2, which, for example, may be representative of the pixel circuit in FIG. 2. Referring to FIG. 5, a pixel circuit 142' includes the driving transistor MD, the third transistor M3, fourth transistors M4_1 and M4_2, the fifth transistor M5, the sixth transistor M6, and the storage capacitor Cst. The fourth transistors M4_1 and M4_2 are serially connected between the second node N2 and the second electrode of the driving transistor MD. Then, gate electrodes of the fourth transistors M4_1 and M4_2 are connected to the ith scan line Si. The fourth transistors M4_1 and M4_2 are turned on when the scan signal is supplied to the ith scan line Si and diode-connect the driving transistor MD.

According to this embodiment, the fourth transistors M4_1 and M4_2 are formed between the second node N2 and the second electrode of the driving transistor MD. As a result, leakage current from the second node N2 to the second electrode of the driving transistor MD may be reduced or minimized to improve picture quality.

In one embodiment, at least one fourth transistor M4 may be between the second node N2 and the second electrode of the driving transistor MD based, for example, on the kind and resolution of the panel.

Figure 6:
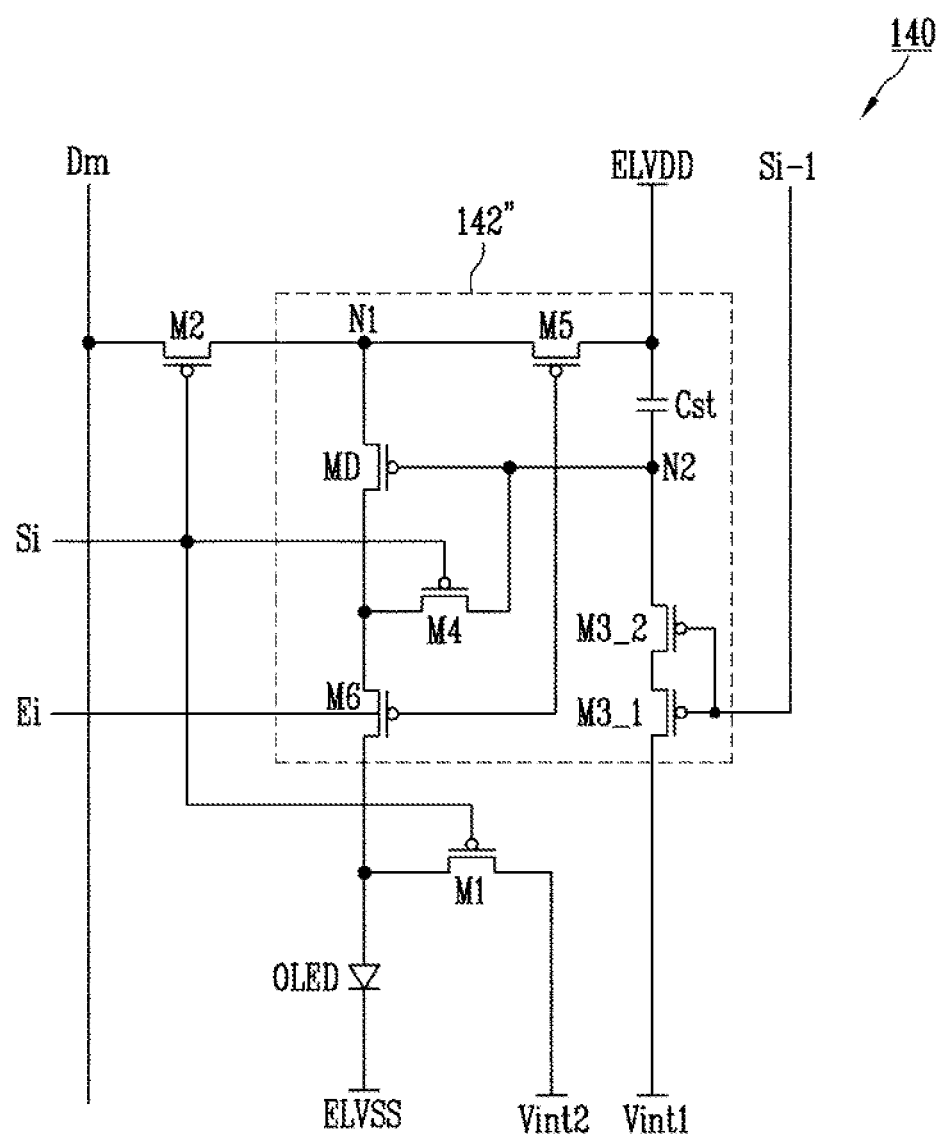
FIG. 6 illustrates another embodiment of a pixel circuit.

FIG. 6 illustrates another embodiment of a pixel circuit 142", which, for example, may be representative of the pixel circuit in FIG. 2. Referring to FIG. 6, pixel circuit 142" includes the driving transistor MD, third transistors M3_1 and M3_2, the fourth transistor M4, the fifth transistor M5, the sixth transistor M6, and the storage capacitor Cst. The third transistors M3_1 and M3_2 are serially connected between the second node N2 and the first initializing power source Vint1. Then, gate electrodes of the third transistors M3_1 and M3_2 are connected to the (i-1)th scan line Si-1. The third transistors M3_1 and M3_2 are turned on, when the scan signal is supplied to the (i-1)th scan line Si-1, to supply the voltage of the first initializing power source Vint1 to the second node N2.

According to the present embodiment, the third transistors M3_1 and M3_2 are between the second node N2 and the first initializing power source Vint1. Thus, leakage current from the second node N2 to the first initializing power source Vint1 may be reduced or minimized to improve picture quality. In one embodiment, at least one third transistor M3 may be between the second node N2 and the first initializing power source Vint1 based on, for example, the kind and resolution of the panel.

The transistors in the embodiments described herein may be p-channel metal-oxide-semiconductor field effect transistors (MOSFETs) (PMOSs), n-channel metal-oxide-semiconductor field effect transistors (MOSFETs) (NMOSs), or a combination of these types of transistors.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods for operations of the computer, processor, controller, or other signal processing device) are described in detail, the code or instructions for implementing the operations of the method embodiments may transform the computer, processor, controller, or other signal processing device into a special-purpose processor for performing the methods described herein.

The drivers, controllers, and other signal generating and processing features of the disclosed embodiments may be implemented in logic which, for example, may include hardware, software, or both. When implemented at least partially in hardware, the drivers, controllers, and other signal generating and processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the drivers, controllers, and other signal generating and processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

In accordance with one or more of the aforementioned embodiments, OLEDs may generate various light components (e.g., red, green, and blue light components) in accordance with the amounts of currents supplied from the driving transistors. In addition, the OLEDs may generate white light components in accordance with the amounts of currents supplied from the driving transistors. In addition, colors of light components may be controlled by using color filters other than the OLEDs.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:
1. A pixel, comprising:
an organic light emitting diode (OLED);
a driving transistor to control an amount of current that flows from a first power source to a second power source via the OLED;
a first transistor directly connected between a fourth power source and a first electrode of the OLED, the first transistor having a gate electrode connected to a first scan line;
a second transistor directly connected between a data line and a first electrode of the driving transistor, the second transistor having a gate electrode connected to the first scan line;
at least one third transistor connected between a gate electrode of the driving transistor and a third power source, the at least one third transistor having a gate electrode connected to a second scan line different from the first scan line; and
a fifth transistor connected between the first electrode of the driving transistor and the first power source, the fifth transistor to have a turn-on period that does not overlap a turn-on period of the second transistor, wherein the gate electrode of the first transistor and the gate electrode of the second transistor are connected in common to the first scan line and are simultaneously controlled, wherein a voltage of the third power source is greater than a voltage of the fourth power source.

2. The pixel as claimed in claim 1, further comprising:

at least one fourth transistor connected between the gate electrode of the driving transistor and a second electrode of the driving transistor, the at least one fourth transistor having a gate electrode connected to the first scan line.

3. The pixel as claimed in claim 2, further comprising:

a sixth transistor connected between the second electrode of the driving transistor and the first electrode of the OLED, the fifth and sixth transistors to be simultaneously turned on and turned off.

4. The pixel as claimed in claim 3, wherein the second transistor is connected to the first electrode of the driving transistor.

5. The pixel as claimed in claim 1, wherein the gate electrode of the first transistor is directly connected to the gate electrode of the second transistor, wherein the first transistor is to be turned on based on a scan signal supplied to the first scan line.

6. The pixel as claimed in claim 1, wherein a voltage of the fourth power source is greater than a voltage of the second power source.

7. The pixel as claimed in claim 1, wherein a voltage of the third power source is lower than a voltage of a data signal supplied to the data line.

8. An organic light emitting display device, comprising:

a plurality of pixels connected to scan lines, data lines, and emission control lines;

a scan driver to supply scan signals to the scan lines;

an emission control driver to supply emission control signals to the emission control lines; and a data driver to supply data signals to the data lines, wherein each of the pixels on an ith (i is a natural number) horizontal line comprises:

an organic light emitting diode (OLED);

a driving transistor to control an amount of current that flows from a first power source to a second power source via the OLED;

a first transistor directly connected between a fourth power source and a first electrode of the OLED, the first transistor to be turned on when a scan signal is supplied to an ith (i is a natural number) scan line;

a second transistor directly connected between a data line and the driving transistor, the second transistor to be turned on when a scan signal is supplied to the ith scan line;

at least one third transistor connected between a gate electrode of the driving transistor and a third power source, the at least one third transistor to be turned on based on the scan signal supplied to an (i-1)th scan line; and a fifth transistor connected between a first electrode of the driving transistor and the first power source, the fifth transistor to have a turn-on period that does not overlap a turn-on period of the second transistor, wherein a gate electrode of the first transistor and a gate electrode of the second transistor are connected in common to the ith scan line and are simultaneously controlled, wherein the scan signal supplied to the ith scan line does not overlap the scan signal supplied to the (i-1)th scan line, wherein a voltage of the third power source is greater than a voltage of the fourth power source.

9. The display device as claimed in claim 8, wherein each of the pixels on the ith horizontal line further comprises:

at least one fourth transistor connected between the gate electrode of the driving transistor and a second electrode of the driving transistor, the at least one fourth transistor to be turned on based on the scan signal supplied to the ith scan line.

10. The display device as claimed in claim 9, further comprising:

a sixth transistor connected between the second electrode of the driving transistor and the first electrode of the OLED, the fifth and sixth transistors to be simultaneously turned on and turned off.

11. The display device as claimed in claim 9, wherein the first transistor is to be turned on based on the scan signal supplied to the ith scan line.

12. The display device as claimed in claim 8, wherein the gate electrode of the first transistor is directly connected to the gate electrode of the second transistor, wherein a voltage of the fourth power source is greater than a voltage of the second power source.

13. The display device as claimed in claim 8, wherein a voltage of the third power source is lower than a voltage of a data signal supplied to the data line.

14. A method for driving an organic light emitting display device having pixels connected to scan lines and data lines, the pixels each including a driving transistor to control a current supplied to a respective organic light emitting diode (OLED) based on a respective data signal, the method comprising:

initializing gate electrodes of the driving transistors based on a second scan signal and a voltage of a third power source;

storing the data signals based on a first scan signal;

initializing anode electrodes of the OLEDs based on the first scan signal and a voltage of a fourth power source;

controlling currents that flow from a first power source to a second power source, via the OLEDs, based on the data signals; and controlling a turn-on period overlap between a fifth transistor connected between a first electrode of a driving transistor and the first power source, and a second transistor connected between a data line and the first electrode of the driving transistor, the fifth transistor to have a turn-on period that does not overlap a turn-on period of the second transistor, wherein the first scan signal does not overlap the second scan signal, wherein the voltage of the third power source is greater than the voltage of the fourth power source.

15. The method as claimed in claim 14, wherein the voltage of the fourth power source is greater than a voltage of the second power source.

16. The method as claimed in claim 14, wherein the voltage of the third power source is lower than a voltage of the data signal.

17. The method as claimed in claim 14, wherein storing the data signals and initializing anode electrodes of the OLEDs is performed using a diode-connected driving transistor, wherein when the data signal is supplied, an anode electrode of the OLED is initialized by the fourth power source.

\* \* \* \* \*